United States Patent [19]
Garg et al.

[11] Patent Number: 5,186,973
[45] Date of Patent: Feb. 16, 1993

[54] HFCVD METHOD FOR PRODUCING THICK, ADHERENT AND COHERENT POLYCRYSTALLINE DIAMONDS FILMS

[75] Inventors: Diwakar Garg, Macungie, Pa.; Wilman Tsai, Cupertino, Calif.; Fred M. Kimock, Macungie, Pa.; Robert L. Iampietro, Emmaus, Pa.; Paul N. Dyer, Allentown, Pa.

[73] Assignee: Diamonex, Incorporated, Allentown, Pa.

[21] Appl. No.: 582,439

[22] Filed: Sep. 13, 1990

[51] Int. Cl.$^5$ .......................... B05D 3/06; C23C 16/26
[52] U.S. Cl. .................................. 427/590; 427/249; 427/314; 427/587; 428/408
[58] Field of Search .................... 427/38, 249, 49, 50, 427/314; 423/446; 428/408; 156/DIG. 68

[56] References Cited

U.S. PATENT DOCUMENTS

| | | | |
|---|---|---|---|
| 4,816,286 | 3/1989 | Hirose | 427/39 |
| 4,849,290 | 7/1989 | Fujimori et al. | 428/408 |
| 4,919,974 | 4/1990 | McCune et al. | 427/249 |
| 4,940,015 | 7/1990 | Kobashi et al. | 427/39 |

FOREIGN PATENT DOCUMENTS 1-203295 8/1989 Japan.

*Primary Examiner*—Shrive Beck
*Assistant Examiner*—Roy V. King
*Attorney, Agent, or Firm*—McCubbrey, Bartels, Meyer & Ward

[57] ABSTRACT

A method for depositing a thick, adherent and coherent polycrystalline diamond (PCD) film onto a metallic substrate using a deposition rate of no greater than 0.4 $\mu$m per hour. The resulting PCD Film has a smooth surface finish, enhanced crystal orientation in comparision to industrial grade diamond powder particularly in the (220) and (400) directions, and excellent electrical and thermal properties. The method enables one to deposit PCD films having a thickness of at least 12 microns for applications on flat as well as curved substrates having wide use in the electronics industry. Thick PCD films of this invention have been found to be ideal for dissipating heat from radio frequency (RF) and microwave (MW) devices.

13 Claims, 6 Drawing Sheets

HFCVD METHOD FOR PRODUCING THICK, ADHERENT AND COHERENT POLYCRYSTALLINE DIAMONDS FILMS

FIELD OF THE INVENTION

This invention relates generally to the manufacture of polycrystalline diamond (PCD) coated substrates having particular application in integrated circuit devices. More particularly, the invention relates to method for producing a coated substrate product having high electrical resistivity. The product comprises a thick, adherent and coherent polycrystalline diamond (PCD) layer deposited on a substrate.

BACKGROUND OF THE INVENTION

A number of chemical vapor deposition (CVD) techniques including hot filament CVD (HFCVD), RF plasma assisted CVD, microwave plasma assisted CVD, DC plasma assisted CVD and laser assisted CVD methods have been used to deposit thin (1–10 μm), adherent and coherent PCD films on a variety of substrates. However, these methods have not been successful in depositing thick ($\geq 12$ μm) PCD films adherently and coherently on metallic and ceramic substrates. Furthermore, the films deposited by these techniques have been found to have poor electrical properties, making them unsuitable for the electronics industry.

The electrical properties of PCD films can be greatly improved by depositing them with enhanced crystal orientation in the (220) and (400) directions, as disclosed in the commonly assigned copending patent application, U.S. patent Ser. No. 497,161, filed Mar. 20, 1990, now abandoned. These PCD films have been successfully deposited at low as well as high rates on metallic substrates such as molybdenum and ceramics such as silicon with good adhesion. The adhesion of PCD film deposited at high rates (>0.4μm/hr) has, however, been shown to be good as long as the film thickness is limited to ~10μm. Although it is possible to deposit thicker to ~10 films (>10μm) at high rates both on molybdenum and silicon, their adhesion to these substrates has been noted to be poor. The thick PCD films on molybdenum have been found to simply flake off during cooling of the coated specimens from the deposition temperature to room temperature. Likewise, the thick films on silicon have been noted to be under high stresses, causing the coated silicon wafer to disintegrate into pieces. The problems related to depositing such thick PCD films are set forth more fully below.

Several attempts have been made by researchers to deposit thick PCD films on metallic and ceramic substrates with limited success. The differences between the coefficients of thermal expansion of diamond and metals cause the thick PCD films to separate from metallic substrates as the coated substrates cool from deposition temperature to room temperature, as reported by Peter Taborek in a recent paper entitled, "Optical Properties of Microcrystalline CVD Diamond," published in SPIE, Vol. 1112, Window and Dome Technologies and Materials, 205–209 (1989).

The thick PCD films have been reported to adhere well to a silicon substrate, but they have been found to be under high stresses (apparent from the resulting curvature of the substrate). In some cases stresses are great enough to cause the silicon wafer to disintegrate into pieces, as reported by D. Morrison and J. A. Savage in a paper entitled, "Optical Characteristics of Diamond Grown by Plasma Assisted Chemical Vapor Deposition," published in SPIE, Vol. 1112, Window and Dome Technologies and Materials, 186–191 (1989). Therefore, there is a need to develop technology to deposit thick PCD film adherently and coherently on metallic and ceramic substrates.

Japanese Kokai Patent No. Sho 63(1988)-307196, published Dec.14, 1988, discloses a microwave plasma assisted CVD method of manufacturing multilayered PCD film preferentially oriented in the (220) crystalline direction. In this patent application, the diamond deposition conditions such as the concentration of methane in hydrogen are changed continuously or discontinuously to deposit distinct diamond layers with different properties. For example, the first layer of the microcrystal diamond film with $\sim 0.1$ μm thickness is formed using high concentrations of methane in hydrogen (such as 2%). The second layer is deposited on the first layer with good crystallinity using low concentrations of methane in hydrogen (such as 0.3%). This application does not disclose a method of depositing thick, uniform, adherent and coherent PCD film on a substrate.

U.S. Pat. No. 4,816,286 discloses an HFCVD method for depositing PCD film to a thickness as high as 28 μm on various substrates at deposition rates of about 3 μm per hour and higher; see Examples 1–8 starting at column 5, line 48 through Table 1 bridging columns 7 and 8. It has been found that at this rate of deposition the adhesion of PCD films to the substrates is poor.

Thin (~10 μm) PCD films are suitable for many applications including low-power, direct-current, or low-frequency devices for dissipating heat from the devices as well as for isolating the devices from the base materials. They are, however, not suitable for high-frequency and/or high-power devices with large areas because of their high capacitance. The desired value of capacitance for these devices is $\leq 3$pF, requiring the use of thick PCD films for these applications. The thickness of a PCD film required for a particular application depends largely upon the device area and can be calculated by the following expression:

$$C = E_o K \frac{A}{t}$$

where:
C = capacitance of PCD film in pF
K = dielectric constant of PCD film (assumed to be 5.5 for diamond)
A = device or chip area (cm$^2$)
t = PCD film thickness (cm)
$E_o$ = free-space permittivity (8.85 × 10$^{-2}$ pF/cm)

A relationship between PCD film thickness and device or chip area can thus be established by plugging in the values of Eo, K and desired capacitance in the above equation. The relationship between film thickness and device area can therefore be represented by the following expression:

$$t \geq 0.162 A$$

This expression can be used to calculate the minimum thickness of PCD film required for devices having different areas, and the calculated values are summarized below.

| Device Area, cm² | | | | | | | |
|---|---|---|---|---|---|---|---|
| 1.1 × 10⁻³ | 10 × 10⁻³ | 15 × 10⁻³ | 20 × 10⁻³ | 25 × 10⁻³ | 30 × 10⁻³ | 50 × 10⁻³ | 80 × 10⁻³ |
| 2 | 16 | 24 | 32 | 41 | 49 | 81 | 130 |
| Film Thickness, μm | | | | | | | |

These values indicate that 10 μm thick PCD films will be suitable only for devices with area $<10\times10^{-3}$ cm². The devices commonly used by the electronics industry have areas $\geq 10\times 10^{-3}$ cm², suggesting that the film thickness has to be $\geq 16$ μm to meet capacitance requirement. Therefore, there is a need for depositing thick PCD films on metallic and ceramic substrates with good adhesion and electrical properties. Further, the surface finish of polycrystalline diamond films can also be enhanced over that of prior art PCD films by depositing diamond crystals with enhanced orientation in at least two directions. This is an important feature in regard to mounting the device on the PCD film.

SUMMARY OF THE INVENTION

The method of the present invention produces improved composite structures which substantially reduce or eliminate the disadvantages and shortcomings associated with the prior art structures. According to the method, a thick polycrystalline diamond film is chemically vapor deposited by an HFCVD technique on metallic or ceramic substrates at a deposition rate of no greater than 0.4 μm per hour. The resulting PCD film is at least 12 μm thick and has a substantially uniform microstructure and smooth surface finish.

In a more specific embodiment of the present invention, the PCD film is chemically vapor deposited on metallic or ceramic substrates by the HFCVD technique with predetermined deposition parameters, such that the PCD film is deposited with an enhanced crystal orientation and excellent electrical properties and surface finish. The intensity of (hkl) reflection in the (220) or (311) direction and the (400) direction relative to (111) direction of the PCD film of the present invention are enhanced over that of industrial grade diamonds. The diamond films of this invention exhibit particularly high electrical resistivity.

BRIEF DESCRIPTION OF THE DRAWINGS

Further features and advantages of the method disclosed herein will become apparent from the following and more particular description of the preferred embodiment of the invention as illustrated in the accompanying drawings, in which.

DETAILED DESCRIPTION OF THE INVENTION

Figure 1:
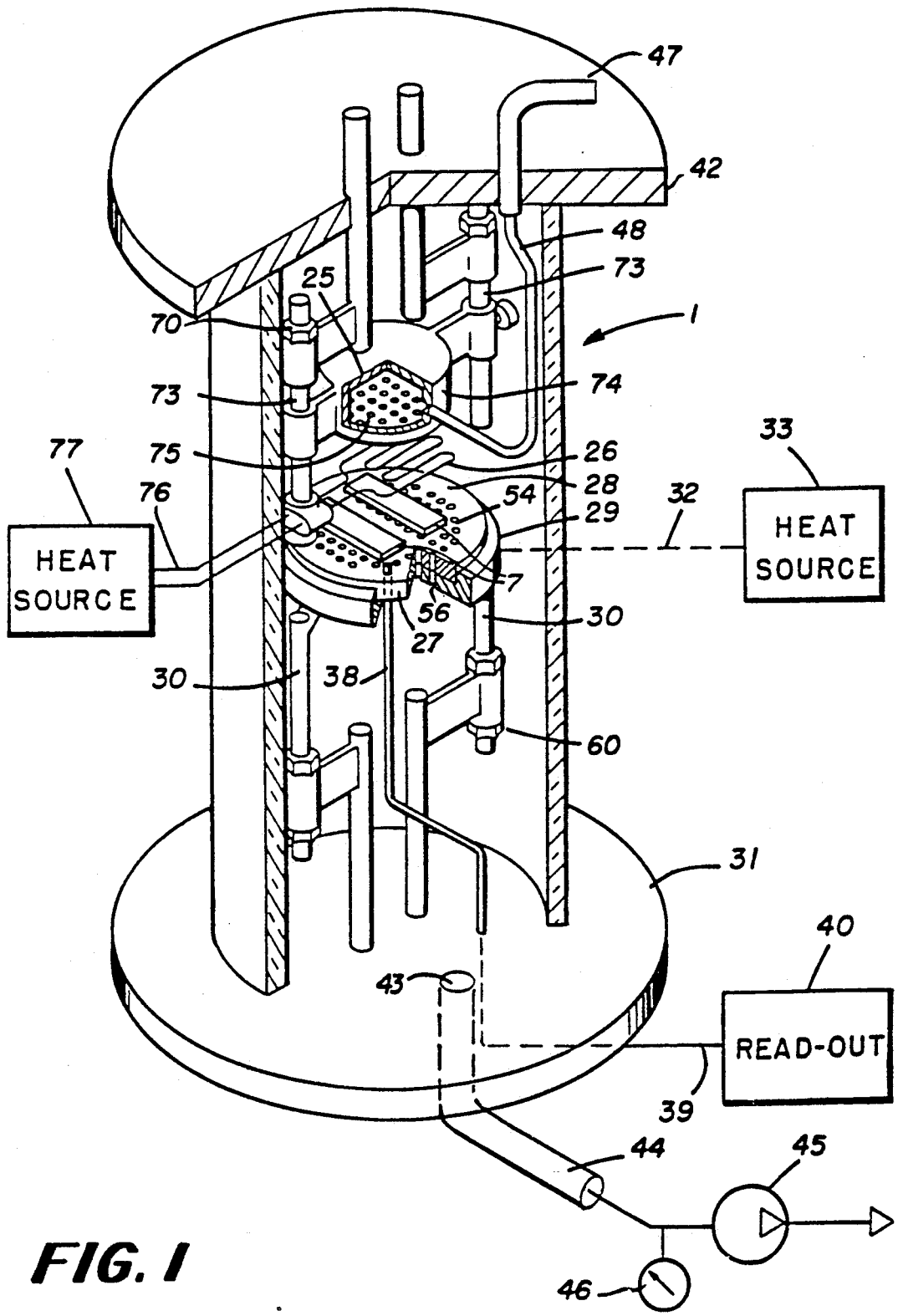
FIG. 1 is a simplified sectional view of a type of HFCVD reactor for use in carrying out the method of the present invention.

Thick PCD films can be deposited by carefully manipulating the build-up of stresses in the films. The build-up of stresses in the thick PCD films are controlled by employing one of the following methods:

(1) using low deposition rates ($<0.4$ μm/hr.), which method is disclosed and claimed herein;

(2) periodically interrupting the deposition process by subjecting the coated substrate with a cool-down step, i.e. a step in which the coated substrate is cooled to substantially below the deposition temperature, which method and resulting composition is disclosed and claimed in the copending patent application, Ser. No. 582,515, filed Sep. 13, 1990 now U.S. Pat. No. 5,124,179; or (3) cycling the deposition temperature or other deposition parameters during the deposition of the PCD films, which method and resulting composition is disclosed and claimed in the commonly assigned copending patent application, Ser. No. 582,517, filed Sep. 13, 1990, now abandoned.

Each of these methods have been found to result in altering the microstructure of the PCD films, thereby helping in depositing thick films with reduced stresses. The thick films deposited by using these methods have been demonstrated to have good surface finish, adhesion and electrical properties.

The product of the method of the present invention comprises a parent substrate and a polycrystalline diamond layer. The substrate on which diamond film is deposited comprises a single crystal such as diamond, silicon carbide, silicon, sapphire, and similar materials; a polycrystalline material such as silicon; a metal such as tungsten, molybdenum, titanium, tantalum, copper, and the like; a mixture of metals such an tungsten and molybdenum, tungsten and copper, molybdenum and copper, and the like; a ceramic material such as hot pressed, sintered or chemically vapor produced ceramics including silicon carbide, silicon nitride, polycrystalline diamond, cemented carbides, alumina, and the like or mixtures thereof. The substrate may contain various other layers and structures which constitute integrated circuitry. Such layers and structures may be formed before or after the application of the polycrystalline diamond layer.

Preferably the PCD layer is chemically vapor deposited on the substrate by means of a conventional deposition technique such that the diamond layer exhibits an enhanced crystal orientation in the (220) and the (400) directions. In particular the intensity of (hkl) reflection in the (220) and (400) directions in the film of the present invention are at least 47 and 12 percent, respectively relative to (111) intensity, which is normalized to 100. The resulting structure thus enables the isolation of circuits and silicon devices from one another and from the base substrate via superior electrical properties of the polycrystalline diamond film and exhibits a superior surface finish by substantially reducing the faceted crystals.

In the preferred embodiment of the invention, the polycrystalline diamond layer is chemically vapor deposited on a single crystal, a polycrystalline material, hard metal, metal alloy, mixture of metals, ceramic substrate or mixtures thereof, such that the polycrystalline diamond layer exhibits enhanced crystal orientation in either the (220) or the (311) direction and the (400) direction over that of industrial grade of diamonds. By the phrase "chemically vapor deposited," it is meant the deposition of a layer of polycrystalline diamond resulting from the thermal decomposition of a mixture of hydrogen and carbon compounds, preferably hydrocarbons, into diamond generating carbon atoms preferentially from the gas phase activated in such a way as to avoid substantially the deposition of graphitic carbon. The specific types of carbon compounds useful in this method include $C_1$-$C_4$ saturated hydrocarbons such as methane, ethane, propane and butane; $C_1$-$C_4$ unsaturated hydrocarbons such as acetylene, ethylene, propylene and butylene; gases containing C and O such as carbon monoxide and carbon dioxide; aromatic compounds such as benzene, toluene, xylene, and the like; and organic compounds containing C, H, and at least one of oxygen and/or nitrogen such as methanol, ethanol, propanol, dimethyl ether, diethyl ether, methylamine, ethylamine, acetone, and similar materials (a detailed list of organic compounds that can be used to deposit a diamond layer is provided in U.S. Pat. No. 4,816,286, which patent is incorporated herein by reference). The organic compound can be in admixture with water as described in Japanese Kokai Patent Publication No. Sho 64(1989)-24093, published Jan. 26, 1989, which publication is incorporated herein by reference. The concentration of carbon compounds in the hydrogen gas can vary from about 0.1% to about 5%, preferably from about 0.2% to 3%, and more preferably from about 0.5% to 2%. The resulting diamond film in such a deposition method is in the form of adherent individual crystallites or a layer-like agglomerates of crystallites substantially free from intercrystalline adhesion binder.

The total thickness of the polycrystalline diamond film is at least about 12 μm. Preferably, the total thickness of the diamond film is about 12 μm to 250 μm. Still more preferably, it is about 20 μm to about 130 μm.

The polycrystalline diamond film may be deposited in the preferred embodiment of the present invention by using an HFCVD reactor such as reactor 1 illustrated in FIG. 1. The HFCVD technique involves activating a feed gaseous mixture containing a mixture of hydrocarbon and hydrogen by a heated filament and flowing the activated gaseous mixture over a heated substrate to deposit the polycrystalline diamond film. The feed gas mixture, containing from 0.1 to about 5% hydrocarbon in hydrogen, is thermally activated under sub-atmosphere pressure ($\leq 100$ torr) to produce hydrocarbon radicals and atomic hydrogen by using a heated filament made of W, Ta, Mo, Re or a mixture thereof. The filament is electrically heated to a temperature ranging from about 1800° to 2250° C. The substrate on which the PCD film is to be deposited is heated to a temperature ranging from about 650. to 825.C. The control of substrate or deposition temperature at or below 825° C. is critical for depositing the polycrystalline diamond film with enhanced crystal orientation, excellent electrical properties, and excellent surface finish. The use of deposition temperatures above 825° C. has been found to result in polycrystalline diamond films with random crystal orientation. The use of deposition temperatures below 650° C., on the other hand, has been found to result in deposition of diamond films at extremely low and impractical rates.

After a period of at least 30 hours of polycrystalline diamond deposition time when the desired thickness of at least 12 μm has been achieved, the reactive gaseous mixture is stopped and an inert gas, i.e., argon, helium and the like, is passed over said coated substrate while the filament remains electrically charged for a period of time to purge the activated gaseous mixture from the reactor and then the coated substrate is cooled by removing the charge from the filament while continuing to pass the inert gas over the substrate.

Referring now to FIG. 1, HFCVD reactor 1 for chemical vapor depositing a PCD film onto substrates 7 comprises a gas dispersion system 25, a filament network 26 and an apertured support plate 27. Gas dispersion system 25 and apertured support plate 27 are oriented within reactor 1 so that their surfaces are perpendicular to the axis of the gas flow through the reaction zone 28. Substrates 7 to be coated are supported by the apertured support plate 27 which rests on an apertured substrate heater 29. Substrate heater 29 is attached to adjustable rods 30, which are mounted to the reactor base 31. Substrate heater 29 is provided with lead 32 to which an electrical heating current is conducted from a suitable heat source 33. Substrate heater 29 is also provided with a thermocouple 38 to measure substrate temperature and a connecting electrical lead 39 through which the thermocouple output is transmitted to an external read-out or recorder/controller 40. To accurately record and control the temperature of the plurality of substrates 7 within the critical range of the method of the present invention, the tip of the thermocouple 38 is placed immediately adjacent to the top surface of one of the substrates, as shown in FIG. 1.

The ends of reactor 1 are enclosed by removable bottom plate 31 and top plate 42 which isolate reactor 1 such that the interior can be evacuated without significant inward leakage from the surrounding ambient atmosphere. In order to regulate the gas pressure within reactor zone 28 and remove reaction product gases, bottom plate 31 is provided with an opening 43 therein through which an exhaust port tube 44 is suitably connected to a vacuum pump 45. A vacuum gauge 46 is connected in the line thereto for indicating the pressure within the reactor chamber. By properly operating the vacuum pump 45, the gas pressure within the reactor chamber may be regulated as desired.

Gas inlet tube 47 is provided which extends through top plate 42. Gas inlet tube 47 is suitably connected to gas dispersion system 25 by means of a gas feed line 48. Gas inlet tube 47 is connected to a gas feed system (not shown) to introduce reactant gases into the reactor at desired flow rates. Preferably the flow rate is adjusted is combination with the deposition time for each cycle so that the PCD deposition rate does not exceed 0.4 μm per hour.

Support plate 27 contains apertures 54 and heater 29 contains apertures 56 in heater 29 aligned with apertures 54 as shown in FIG. 1 to provide a means of flowing the reactant gas through the support plate 27 to reduce the extent of radial (stagnation point) flow adjacent to the substrates 7 and improving coating uniformity thereon. Support plate 27 and the substrate heater 29 assembly are provided with adjustable support rods 30 for varying the distance between substrates 7 and filament network 26, the support rods 30 consisting of threaded posts with lock nuts 60 removably secured thereon.

With the noted reactor apparatus, reactant gas is introduced into the reactor chamber through gas inlet tube 47 and gas feed line 48. Gas feed line 47 is connected to gas dispersion system 25 which introduces the reactant gas into reaction zone 28 of the reactor with substantially uniform axial gas velocity and temperature. Gas dispersion system 25 is supported within the reactor by a pair of adjustable rods 73, suitably connected to reactor cap 42; rods 73 consisting of threaded post with suitable lock nuts 70 removably secured thereon.

Gas dispersion system 25 consists of a thin housing 74 with an apertured bottom surface 75 to introduce and uniformly distribute the reactant gas over filament network 26.

Filament network 26 is also supported in reaction zone 28 by one of the adjustable rods 73. Filament network 26 is provided with lead 76 to which the heating current is conducted from a suitable heat source 77. Filament network 26 extends transversely in reaction zone 28 of the reactor and is oriented such that the maximum cross-sectional area of filament network 26 is perpendicular to the axis of the gas flow in reaction zone 28.

Additional details of the type of reactor system used in the method, of the present invention are found in the commonly assigned copending application, Ser. No. 497,159, filed Mar. 20, 1990, now abandoned; the detailed description of which is incorporated herein by reference.

The controls and examples which follow illustrate the method of the invention and of the coated substrate products produced thereby. The examples are for illustrative purposes only and are not meant to limit the scope of the claims in any way.

PRE-CONDITIONING OF A NEW FILAMENT

A new tantalum filament made of 1 mm diameter and 21.6 cm long wire was fabricated and placed in the small scale HFCVD reactor described above. The total surface area of the filament was $\sim 8.5$ cm$^2$. It was carburized in the reactor using a preferred procedure. The procedure involved heating the filament to $\sim 1800$.C. in presence of 100 sccm flow of 1% $CH_4$ $H_2$ at 30 torr. The filament temperature was increased in steps of 50° C. every 30 minutes until a temperature of -2200.C was reached. This temperature was maintained for 30 minutes. The temperature and flow rate of 1% $CH_4$ in $H_2$ were then reduced to 2100° C. and 20 sccm, respectively, and maintained for another 12 hours. The filament power was then turned off and it was cooled in flowing helium gas. The surface of the filament was carburized well, as evidenced by gold color of TaC. No signs of filament bending were noted during and after carburization. Additionally, no signs of graphitic carbon deposit were seen on the filament.

The filament carburization procedure described above was used prior to using a new filament for depositing PCD films on metallic and ceramic substrates in all the controls and examples described below. In some of the controls and examples a used tantalum filament (filaments used previously in depositing PCD films in one or more experiments) was utilized for depositing PCD films. In no case was a virgin tantalum filament used for depositing PCD films.

CONTROLS

A number of control experiments were carried out to deposit PCD films using the HFCVD technique described above in which the deposition parameters were changed to deposit thin as well as thick films.

CONTROL 1

Two 1.35 in. long ×0.387 in. wide ×0.062 in. thick molybdenum specimens were placed in the same HFCVD reactor described above. The specimens were pre-etched for 3 hours in an ultrasonic bath using a slurry of $\sim 80$ $\mu$m diamond powder in ethanol. They were then heated to $\sim 780°$ C. temperature using a filament made of $\sim 1$ mm diametric tantalum wire, which was pre-carburized, placed $\sim 10$ mm above the specimens and heated to $\sim 2160°$ C. temperature using an AC power supply. The filament temperature was determined by using a dual wavelength pyrometer. The specimen temperature, however, was determined by placing a thermocouple next to its top surface as shown in FIG. 1. A flow of 10 sccm of 1% $CH_4$ in $H_2$ was passed through the reactor for 15 hours to deposit polycrystalline diamond coating on molybdenum specimens, as shown in Table 1. After the deposition time of 15 hours, the flow of feed gas was switched from 10 sccm of 1% $CH_4$ in $H_2$ to $\sim 50$ standard cubic centimeters per minute (sccm) of He. The filament power was turned off after $\frac{1}{2}$ hour and the coated specimens were cooled under flowing He gas. The molybdenum specimens were deposited with 7 $\mu$m thick, adherent and coherent PCD film on the top of 4 $\mu$m thick molybdenum carbide interlayer, which was formed in situ. The rate of PCD deposition in this example was 0.47 $\mu$m/hour. The film exhibited excellent electrical resistivity, as shown in Table 1.

Control 1 showed that thin PCD films can be deposited adherently and coherently on metallic substrates at high deposition rates, i.e. greater than 0.4 $\mu$m/hr.

CONTROL 2

The PCD deposition experiment described in Control 1 was repeated using similar reactor design, type of specimens, and deposition conditions with the exception of using 790° C. specimen temperature, as shown in Table 1. The specimens were pre-etched only for 1 hour in an ultrasonic bath using a slurry of 80 $\mu$m diamond powder in ethanol. The specimens were deposited with $\sim 9$ $\mu$m thick, adherent and coherent PCD film at the top of $\sim 3$ $\mu$m thick molybdenum carbide interlayer, as shown in Table 1. The deposition rate was $\sim 0.60$ $\mu$m/hr. The PCD film exhibited excellent electrical resistivity.

This control indicated that reducing the etching time from 3 hours to 1 hour was not detrimental to the adhesion of PCD film on molybdenum. It also showed that thin PCD films ($\sim 9$ $\mu$m) can be deposited on metallic substrates adherently and coherently at high deposition rates.

CONTROL 3

Figure 2:
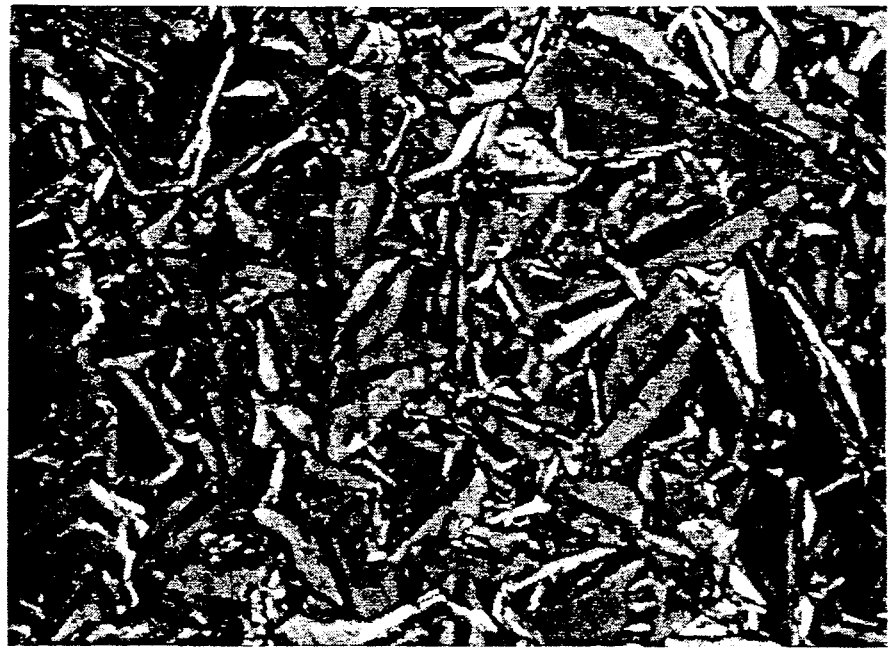
FIGS. 2, 3 and 4 are scanning electron micrographs at 5000 times magnification of compositions comprising PCD films deposited by HFCVD on molybdenum in accordance with the disclosure in the copending application, Ser. No. 497,161, filed Mar. 20, 1990.

The PCD deposition experiment described in Control 2 was repeated with the exception of using 22 hours of deposition time instead of 15 hours, as shown in Table 1. The specimens were, once again, pre-etched only for 1 hour in an ultrasonic bath using a slurry of 80 μm diamond powder in ethanol. The specimens were deposited with ~11 μm thick, adherent and coherent PCD film at the top of 3 μm thick molybdenum carbide interlayer (see Table 1). The deposition rate was ~0.50 μm/hour. The PCD film had fairly good surface finish, as shown in FIG. 2.

This control, once again, indicated no detrimental effects of reducing the etching time from 3 hours to 1 hour in depositing a thin PCD film on molybdenum. It also showed that thin PCD films (~11 cm) can be deposited on metallic substrates adherently and coherently at high deposition rates.

CONTROL 4

The PCD deposition experiment described in Control 1 was repeated using similar reactor design, type of specimens, and deposition conditions with the exception of using 800° C. specimen temperature, as shown in Table 1. The specimens were pre-etched for 2 hours in an ultrasonic bath using a slurry of 80 μm diamond powder in ethanol. The specimens were deposited with ~12 μm thick PCD film at the top of ~5 μm thick molybdenum carbide interlayer. The deposition rate in this experiment was ~0.8 μm/hour, which was higher than that noted in Controls 1 to 3. The PCD film on both specimens spalled off completely probably due to build-up of stresses by high deposition rate. The film had enhanced crystal orientation in (220), (311) and (400) directions relative to (111) direction, as shown in Table 2.

This control showed that PCD films with thicknesses of ~12 μm or greater can not be deposited adherently and coherently on metallic substrates at high deposition rates.

CONTROL 5

Figure 3:
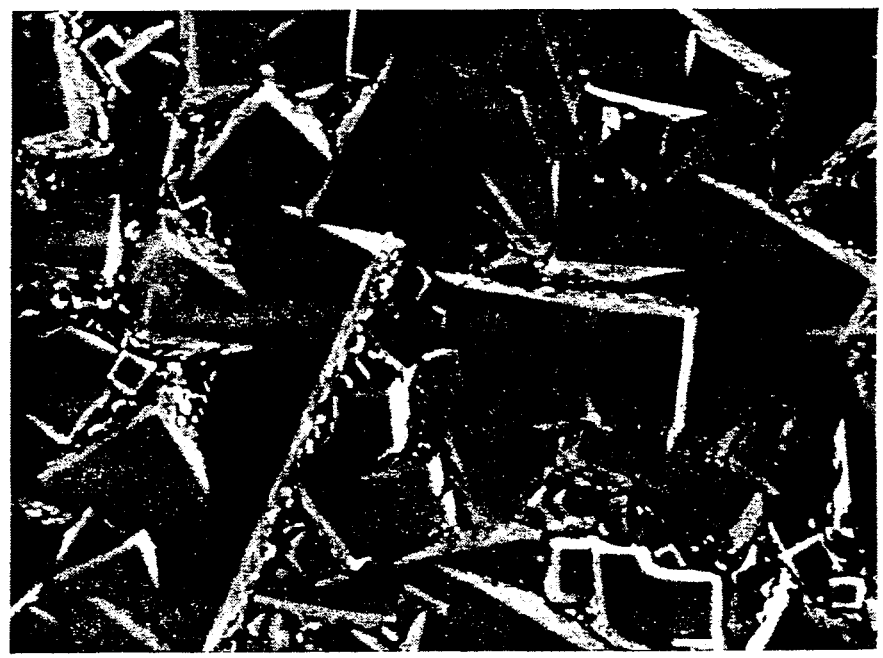

The PCD deposition experiment described in Control 4 was repeated with the exception of using 66 hours of deposition time. One of the specimens was pre-etched for 3 hours in an ultrasonic bath using a slurry of ~80 μm diamond powder in ethanol. The other specimen, on the other hand, was etched by polishing it with a paste containing ~3 μm diamond particles. The PCD film on each of these specimens was ~45 μm thick, resulting in a deposition rate of ~0.68 μm/hr, which was lower than noted in Control 4 but higher than those of Controls 1 to 3. The PCD film had a decent surface finish, as shown in FIG. 3. However, the PCD film on these specimens spalled-off completely, probably due to build-up of stresses by high deposition rate. The film showed enhanced crystal orientation in (220) and (400) directions relative to (111) direction as shown in Table 2.

This control, once again, showed that PCD films with thicknesses ≧12 μm can not be deposited adherently and coherently on metallic substrates at high deposition rates.

CONTROLS 6A and B

One 1.35 in. long ×0.387 in. wide ×0.062 in. thick molybdenum specimen (Control 6A) and one 1.35 in. long ×0.387 in. wide silicon piece (Control 6B) were placed in a reactor described in Control 1.

These specimens were pre-etched for 4 hours in an trasonic bath using a slurry of ~80 μm diamond powder in ethanol. The specimens were heated to ~790° C. temperature using a filament made of ~1 mm diameter tantalum wire, which was placed ~10 mm above the specimens and heated to ~2170° C. temperature using an AC power supply. The filament was pre-carburized using the procedure described earlier. The filament and specimen temperatures were determined using the techniques described in Control 1. A flow of 10 sccm of 1% $CH_4$ in $H_2$ was passed through the reactor for 18 hours to deposit PCD film on molybdenum and silicon specimens, as set forth in Table 1. After the deposition time, the flow of feed gas was switched from 10 sccm of 1% $CH_4$ in $H_2$ to ~50 sccm of He. The filament power was turned off after ½ hour and the coated specimens were cooled under flowing He gas. The molybdenum specimen was deposited with ~7 μm thick, adherent and coherent PCD film at the top of ~3 μm thick carbide interlayer, which was formed in situ. The deposition rate was ~0.39 μm/hr, which was slightly lower than that noted in Controls 1-5. The silicon specimen was also deposited with ~7 μm thick adherent and coherent PCD film at the top of ~1 μm thick carbide interlayer. The coated silicon specimen was, however, bent a little due to build-up of stresses in the film during coating and upon cooling.

Controls 6A and B showed that thin PCD films (<12 μm) can be deposited adherently and coherently on metallic and ceramic substrates at low deposition rates.

CONTROLS 7A and B

Figure 4:
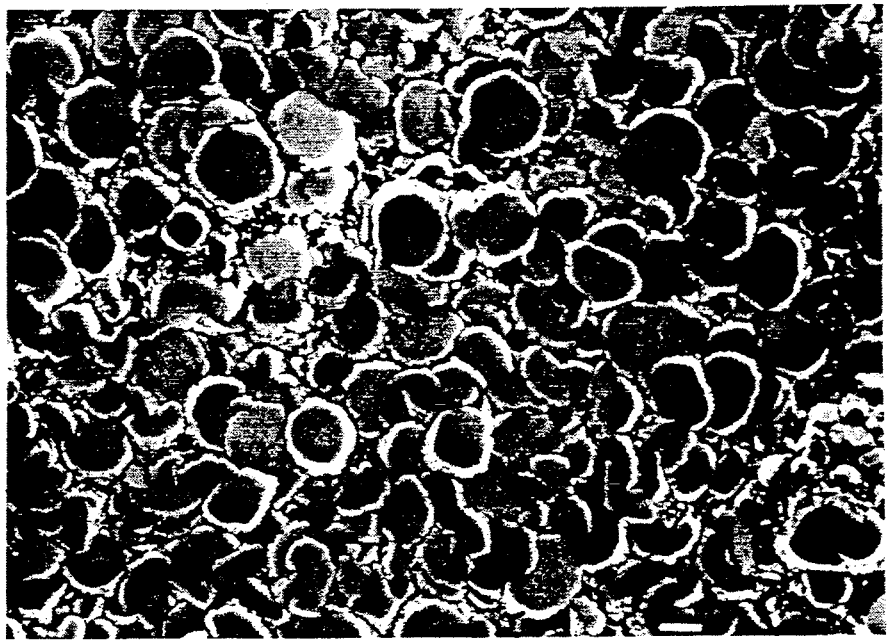
Figure 5:
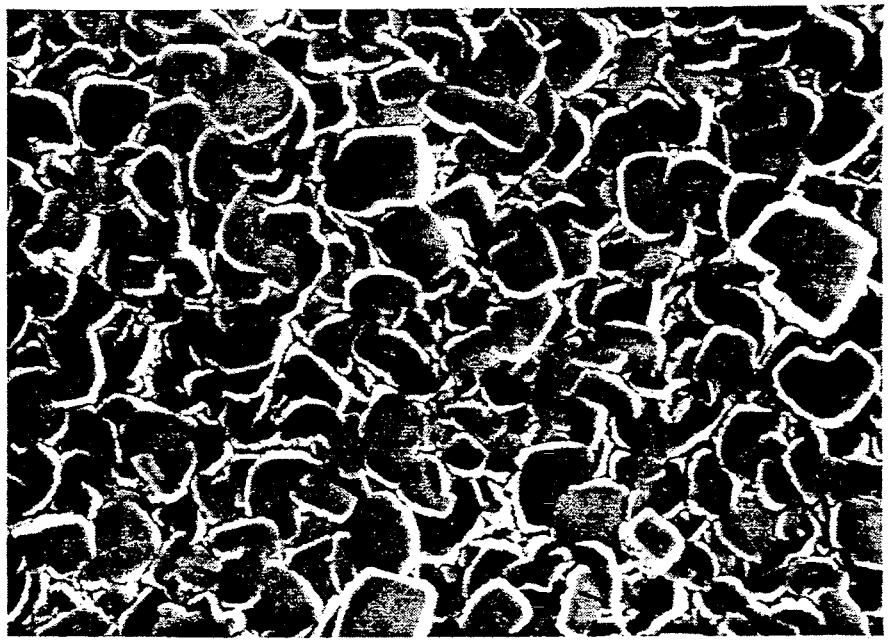
FIG. 5 is scanning electron micrograph at 5000 times magnification of a composition comprising PCD film deposited by HFCVD on silicon in accordance with the disclosure in the copending application, Ser. No. 497,161, filed Mar. 20, 1990.

The PCD deposition experiment described in Controls 6A and B were repeated using similar reactor design, type of specimens, and deposition conditions except for using 780° C. specimen temperature and 16 hours deposition time. The specimens were pre-etched for 2 hours in an ultrasonic bath using a slurry of ~80 μm diamond powder in ethanol. The molybdenum specimen (Control 7A) was deposited with ~7 μm thick adherent and coherent PCD film at the top of ~3 μm thick carbide interlayer as set forth in Table 1. The silicon specimen (Control 7B) was also deposited with ~7 μm thick adherent and coherent PCD film at the top of ~1 μm thick carbide interlayer. The deposition rate both on molybdenum and silicon was 0.44 μm/hr. The coated silicon specimen was, once again, bent a little due to build-up of stresses in the film during coating and upon cooling. The PCD films on molybdenum and silicon specimens had decent surface finish, as shown in FIGS. 4 and 5. The film had enhanced crystal orientation in (220) and (400) directions relative to (111) direction, as shown in Table 2.

Controls 7A and B showed that thin PCD films (<12 μm) with good surface finish can be deposited adherently and coherently on metallic and ceramic substrates at the threshold of high deposition rates.

CONTROLS 8A and B

The PCD deposition experiment described in Controls 7A and B were repeated except for using 60 hours deposition time. The specimens were pre-etched for 3 hours in an ultrasonic bath using a slurry of ~80 μm diamond powder in ethanol. The thickness of PCD resulting in deposition rates of ~0.53 μm/hr. for each of Controls 8A and B as summarized in Table 1, which was very similar to that noted in Controls 1 to 3. The film on molybdenum spalled-off completely. The film spallation could be related to build-up of stresses due to high deposition rate or deposition of thick coating. The film adhered well to silicon, but the coated specimen was bent considerably due to build-up of stresses during coating and upon cooling. In fact, the coated silicon specimen disintegrated into pieces while removing from the reactor.

Control 8A and B showed that thick PCD films, i.e., greater than 11 μm, can not be deposited adherently and coherently on metallic and ceramics substrates when the critical deposition rate exceeded 0.4 μm/hr.

Control 9

Two 1.35 in. long ×0.387 in. wide ×0.062 in. thick molybdenum specimens were placed in a reactor shown in FIG. 1. The specimens were pre-etched for 1 hour in an ultrasonic bath using a slurry of ~80 μm diamond powder in ethanol. The specimens were heated to ~740° C. temperature using a filament made of ~1.5 mm diameter tantalum wire placed ~10 mm above the specimens. The filament was heated to ~1980° C. temperature using an AC power supply. The filament was pre-carburized using the procedure described earlier. The filament and specimen temperatures were determined using the techniques described in Control 1. A flow of 10 sccm of 1% CH$_4$ in H$_2$ was passed through the reactor for 20 hours to deposit PCD film on molybdenum specimens, as shown in Table 1. After the deposition time, the flow of feed gas was switched from 10 sccm of 1% CH$_4$ in H$_2$ to ~50 sccm of He. The filament power was turned off after ½ hour and the coated specimens were cooled under flowing He gas. The molybdenum specimens were deposited with ~4 μm thick, adherent and coherent PCD film at the top of ~2 μm thick carbide interlayer. The deposition rate was ~0.2 μm/hr, which was considerably lower than noted in Controls 1 to 8. The PCD film had excellent electrical resistivity, as shown in Table 1.

This control again showed that thin PCD films exhibiting excellent electrical resistivity can be deposited adherently and coherently on metallic substrates at low deposition rates.

CONTROL 10

The PCD deposition experiment described in Control 9 was repeated using similar reactor design, pre-etching technique, and deposition conditions except for using silicon pieces and 750° C. specimen temperature. The silicon specimens were deposited with ~4 μm thick adherent and coherent PCD film at the top of ~1 μm thick carbide interlayer, which was formed in situ. The deposition rate was ~0.20 μm/hr. The PCD film had excellent electrical resistivity, as shown in Table 1. The coated specimens were however bent slightly due to build-up of stresses during coating and cooling. The film had enhanced crystal orientation in (311) and (400) directions relative to (111) direction, as shown in Table 2.

This control again showed that thin PCD films with excellent electrical resistivity can be deposited on ceramic substrates adherently and coherently at low deposition rates.

CONTROL 11

Two 1.35 in. long ×0.387 in. wide ×0.062 in. thick molybdenum specimens were placed in the same reactor used in the foregoing controls. The specimens were pre-etched for 3 hours in an ultrasonic bath using a slurry of ~80 μm diamond powder in ethanol. The specimens were heated to ~800° C. temperature using a filament made of ~1.25 mm diameter tantalum wire placed ~10 mm above the specimens. The filament was heated to ~2180° C. temperature using an AC power supply. The filament was pre-carburized using the procedure described earlier. The filament and specimen temperatures were determined using the techniques described in Control 1. A flow of 10 sccm of 1% CH$_4$ in H$_2$ was passed through the reactor for 20 hours to deposit PCD film on molybdenum specimens (see Table 1). After the deposition time, the flow of feed gas was switched from 10 sccm of 1% CH$_4$ in H$_2$ to ~50 sccm of He. The filament power was turned off after ½ hour and the coated specimens were cooled under flowing He gas. The molybdenum specimens were deposited with ~6 μm thick, adherent and coherent PCD film at the top of ~2 μm thick carbide interlayer, which was formed in situ. The deposition rate was ~0.3 μm/hr. The film showed good electrical resistivity, as shown in Table 1.

This control again showed that thin PCD films can be deposited adherently and coherently on metallic substrates at deposition rates below 0.4 μm/hr.

CONTROL 12

The PCD deposition experiment described in Control 11 was repeated using similar reactor design, type of specimens, pre-etching technique, and deposition conditions except for using 5 sccm of 1% CH$_4$ in H$_2$ (see Table 1). The specimens were deposited with ~4 μm thick, adherent and coherent PCD film at the top of ~2 μm thick carbide interlayer. The deposition rate was ~0.2 μm/hr. The film showed good electrical resistivity, as documented in Table 1.

This control showed that thin PCD films can be deposited adherently and coherently on metallic substrates at low deposition rates using low flow rate of a mixture of 1% CH$_4$ in H$_2$.

CONTROL 13

The PCD deposition experiment described in Control 11 was repeated again using similar reactor design, type of specimens, pre-etching technique, and deposition conditions except for using 15 sccm of 1% CH$_4$ in H$_2$ (see Table 1). The specimens were deposited with 7 μm thick, adherent and coherent PCD film with good electrical resistivity, as shown in Table 1. The deposition rate was ~0.35 μm/hr.

This control again showed that thin PCD films can be deposited adherently and coherently on metallic substrates at low deposition rates using slightly higher flow rate of 1% CH$_4$ in H$_2$.

CONTROL 14

The PCD deposition experiment described in Control 11 was repeated using similar reactor design, type of specimens, pre-etching technique, and deposition conditions except for using 20 sccm of 1% CH$_4$ in H$_2$ (see Table 1). The specimens were deposited with ~5 μm thick, adherent and coherent PCD film with good electrical resistivity, as shown in Table 1.

This control showed that thin PCD films can be deposited adherently and coherently on metallic substrates at low deposition rates using higher flow rate of 1% methane in $H_2$.

Controls 1 to 14 showed that thin (<11 μm) PCD films can be deposited adherently and coherently on metallic and ceramic substrates at high and low deposition rates. They also showed that the deposition of adherent and coherent thick (>12 μm) PCD films can not be achieved at deposition rates in excess of the critical deposition rate of 0.4 μm/hr. It is believed that the failure of depositing thick PCD films at high deposition rates is related to build-up of stresses, resulting in film delamination.

EXAMPLES

A number of examples were carried out in accordance with the HFCVD method of the present invention to deposit thick PCD films.

EXAMPLE 1

Figure 6:
FIGS. 6, 7 and 9 are scanning electron micrographs at 5000 times magnification of compositions comprising a plurality of PCD films deposited by HFCVD on molybdenum in accordance with the present invention.

The PCD deposition experiment described in Control 9 was repeated using similar reactor design, type of specimens, pre-etching technique and deposition conditions except for using 750° C. specimen temperature and 66 hours deposition time. The specimens were deposited with 13-14 μm thick, adherent and coherent PCD film at the top of ~6 μm thick carbide interlayer. The deposition rate was ~0.2 μm/hr., as shown in Table 3. The PCD film had a decent surface finish, as shown in FIG. 6. Additionally, it had electrical resistivity greater than $1.0 \times 10^6$ ohm-cm (see Table 3).

This example showed that thick PCD films (>12 μm) with good electrical resistivity can be deposited adherently and coherently on metallic substrates at low deposition rates.

EXAMPLE 2

The PCD deposition experiment described in Example 1 was repeated using similar reactor design, type of specimens, pre-etching technique and deposition conditions. The specimens were deposited with ~13 μm thick, coherent and adherent PCD film at the top of ~6 μm thick carbide interlayer. The deposition rate, once again, was ~0.2 μm/hr. (Table 3).

This example therefore showed that thick PCD films (~13 μm) can be deposited adherently and coherently on metallic substrates using low deposition rates.

EXAMPLE 3

Figure 7:
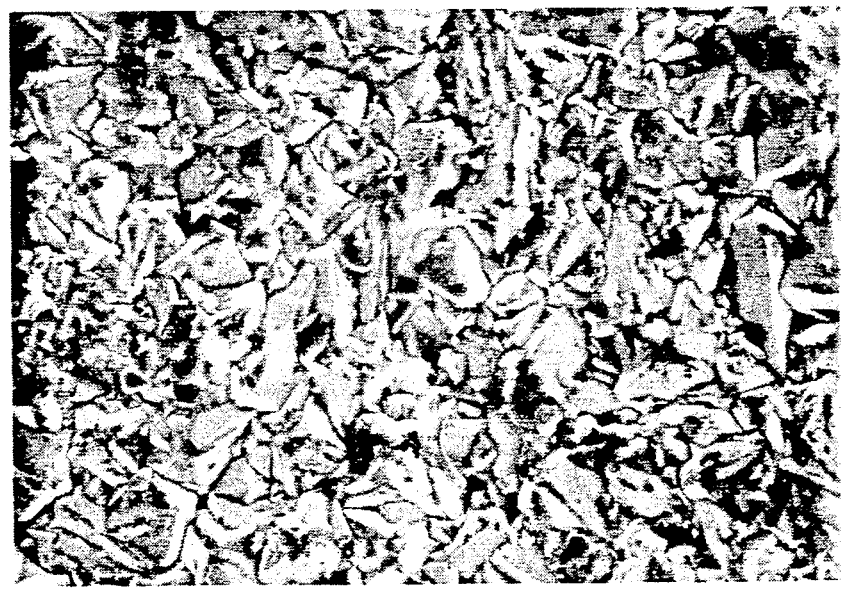

The PCD deposition experiment described in Example 1 was repeated using similar reactor design, type of specimens, pre-etching technique and deposition conditions except for using 40 hours of deposition time and 800° C. deposition temperature (see Table 3). The specimens were deposited with ~13 μm thick, adherent and coherent PCD film at the top of ~3 μm thick carbide interlayer. The deposition rate was ~0.34 μm/hr. The film exhibited good electrical resistivity, as shown in Table 3. Additionally, the film had fairly good surface finish (see FIG. 7).

Figure 8:
FIGS. 8 and 11 are scanning electron micrographs at 5000 times magnification of compositions comprising a plurality of PCD films in cross-section deposited by HFCVD on molybdenum in accordance with the present invention.

The cross-sectional analysis of the film showed fine columnar growth pattern (FIG. 8). The film was characterized by X-ray diffraction to determine the orientation of the crystals. The results of the X-ray diffraction are summarized in Table 4. The orientation of crystals in the industrial grade diamond is also shown in Table 4 for reference purposes. This value has been obtained from the powder diffraction card #PDF 6-675 and represents a random distribution of (hkl) intensities. The orientation of crystals for the Example 3 film were found to be greatly enhanced in the (220) and (400) directions relative to the (111) direction, as shown in Table 4.

This example showed that the orientation of crystals of the thick PCD films of the method of the present invention were greatly enhanced in the (220) and (400) directions relative to the (111) direction over that of industrial grade diamond.

EXAMPLE 4

Figure 9:
Figure 10:
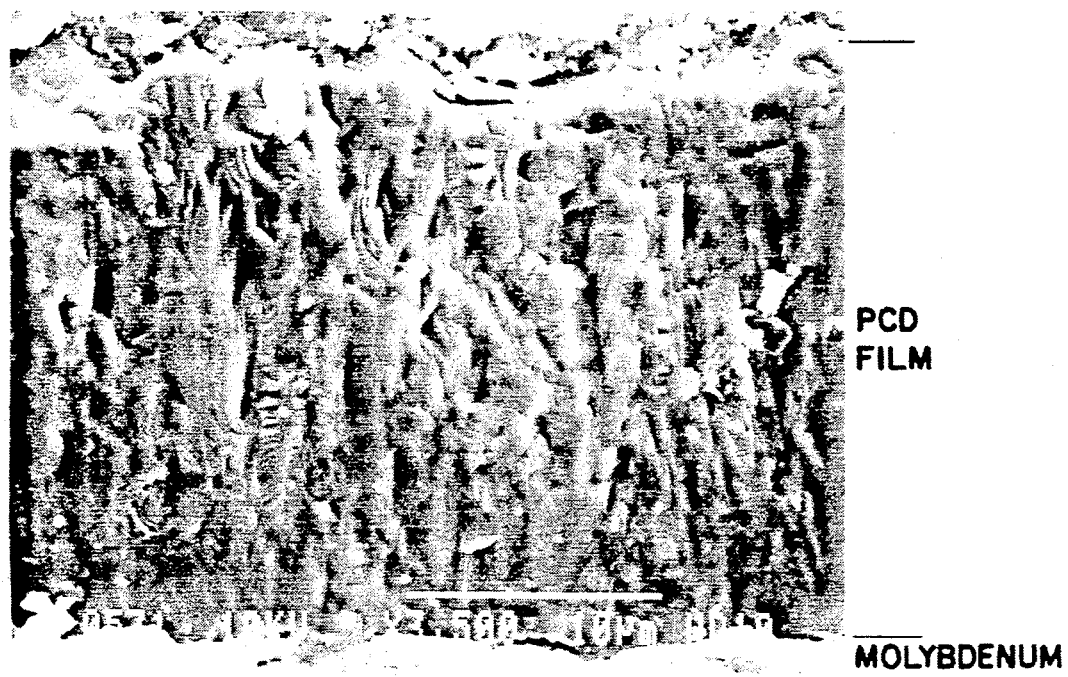
FIG. 10 is scanning electron micrograph at 3500 times magnification of composition comprising a PCD film in cross-section deposited by HFCVD on molybdenum in accordance with the present invention.
Figure 11:

The PCD deposition experiment described in Example 3 was repeated using similar reactor design, type of specimens, pre-etching technique and deposition conditions except for using 60 hours of deposition time (see Table 3). The specimens were deposited with ~20 μm thick, adherent and coherent PCD film at the top of ~6 μm thick carbide interlayer. The deposition rate was 0.33 μm/hr. The surface finish of the PCD film was somewhat rough, as shown in FIG. 9. Cross-sectional analysis of the film showed fine columnar growth pattern (see FIG. 10). It also showed slightly rough surface finish of the film. The roughness of the PCD film is clearly evident at high magnification, as shown in FIG. 11. The orientation of crystals for the Example 4 film were found to be greatly enhanced in the (220) and (400) directions relative to the (111) direction, as shown in Table 4. The film had electrical resistivity greater than $1.0 \times 10^6$ ohm-cm, as shown in Table 3.

This example therefore showed that thick (~20 μm) PCD films can be deposited adherently and coherently on metallic substrates by controlling the deposition rate, namely using just below the critical deposition rate of 0.4 μm/hr. while maintaining the enhanced crystal orientation in the (220) and (400) directions relative to (111) direction over that of industrial grade diamond.

EXAMPLE 5

The PCD deposition experiment described in Example 3 was repeated using similar reactor design, type of specimens, pre-etching technique and deposition conditions except for using 80 hours of deposition time (see Table 2). The specimens were deposited with ~28 μm thick, adherent and coherent PCD film at the top of ~6 μm thick carbide interlayer. The deposition rate was ~0.35 μm/hr. The surface of PCD film was, however, rough.

Again this example showed that thick PCD (~28 μm) films can be deposited adherently and coherently on metallic substrates at deposition rates of 0.35 μm/hr., i.e. just below the critical depostion rate of the present method.

CONCLUSIONS

The foregoing examples illustrate that thick PCD films can be deposited adherently and coherently on metallic and ceramic substrates only by using low deposition rates (≦0.4 μm/hr). They also show that the surface finish of the PCD films degrade as their thickness increases. Thick PCD films with good surface finish can probably be deposited by reducing further the deposition rate. Finally the examples show that the intensity of (hkl) reflection in the (220) direction and the (400) direction relative to (111) of the film of the present invention are enhanced over that of industrial grade of diamonds.

Without departing from the spirit and scope of this invention, one of ordinary skill can make various changes and modification to the invention to adapt it to various usages and conditions. As such, these changes and modifications are properly, equitably, and intended to be, within the full range of equivalence of the following claims.

TABLE 1

| Control | 1[a] | 2[a] | 3[a] | 4[a] | 5[a] | 6A[a] | 6B[a] | 7A[a] | 7B[a] | 8A[a] | 8B[a] |
|---|---|---|---|---|---|---|---|---|---|---|---|
| Experiment No. | 49-1 | 47-1 | 55-1 | 46-1 | 41-1 | 44-1 | 44-1 | 45-1 | 45-1 | 53-1 | 53-1 |
| Substrate | Mo | Mo | Mo | Mo | Mo | Mo | Si | Mo | Si | Mo | Si |
| Substrate Temp., °C. | 780 | 790 | 790 | 800 | 800 | 790 | 790 | 780 | 780 | 790 | 790 |
| Filament Temp., °C. | 2160 | 2180 | 2180 | 2210 | 2190 | 2170 | 2170 | 2160 | 2160 | 2170 | 2170 |
| Flow Rate of 1% $CH_4$ in $H_2$, sccm | 10 | 10 | 10 | 10 | 10 | 10 | 10 | 10 | 10 | 10 | 10 |
| Total Pressure, Torr | 30 | 30 | 30 | 30 | 30 | 30 | 30 | 30 | 30 | 30 | 30 |
| Deposition Time, Hrs. | 15 | 15 | 22 | 15 | 66 | 18 | 18 | 16 | 16 | 60 | 60 |
| Thickness, μm | | | | | | | | | | | |
| Molybdenum Carbide | ~4 | ~3 | ~3 | ~5 | N.D. | ~3 | ~1 | ~3 | ~1 | N.D. | N.D. |
| Diamond | ~7 | ~9 | ~11 | ~12 | ~45 | ~7 | ~4 | ~7 | ~7 | ~32 | ~32 |
| Deposition Rate, μm/hr | 0.47 | 60 | 0.50 | 0.80 | 0.68 | 0.39 | 0.39 | 0.44 | 0.44 | 0.53 | 0.53 |
| Resistivity, Ohm-cm | $1.1 \times 10^{12}$ | $3.2 \times 10^{11}$ | N.D. | N.D. | N.D. | N.D. | N.D. | N.D. | N.D. | N.D. | N.D. |
| Observations | * | * | * | ** | ** | * | * | * | * | ** | * |

| Control | 9[b] | 10[b] | 11[c] | 12[c] | 13[c] | 14[c] |
|---|---|---|---|---|---|---|
| Experiment No. | 61-1 | 71-1 | 5-3 | 6-3 | 7-3 | 8-3 |
| Substrate | Mo | Si | Mo | Mo | Mo | Mo |
| Substrate Temp., °C. | 740 | 750 | 800 | 800 | 800 | 800 |
| Filament Temp., °C. | 1980 | 1980 | 2180 | 2160 | 2170 | 2180 |
| Flow Rate of 1% $CH_4$ in $H_2$, sccm | 10 | 10 | 10 | 5 | 15 | 20 |
| Total Pressure, Torr | 30 | 30 | 30 | 30 | 30 | 30 |
| Deposition Time, Hrs. | 20 | 20 | 20 | 20 | 20 | 20 |
| Thickness, μm | | | | | | |
| Molybdenum Carbide | ~2 | ~1 | ~2 | ~2 | ~2 | ~2 |
| Diamond | ~4 | ~4 | ~6 | ~4 | ~7 | ~5 |
| Deposition Rate, μm/hr | 0.20 | 0.20 | 0.30 | 0.20 | 0.35 | 0.25 |
| Resistivity, Ohm-cm | $4.8 \times 10^{10}$ | $3.2 \times 10^{10}$ | $1.3 \times 10^{10}$ | $2.1 \times 10^{9}$ | $1.1 \times 10^{8}$ | $3.1 \times 10^{8}$ |
| Observations | * | * | * | * | * | * |

[a]The diameter of tantalum wire used for making filament in these experiments was ~1 mm.
[b]The diameter of tantalum wire used for making filament in these experiments was ~1.5 mm.
[c]The diameter of tantalum wire used for making filament in these experiments was ~1.25 mm.
*Adherent and coherent film.
**Film spalled completely
N.D. - Not determined

TABLE 2
Crystal Orientation and Average Size of PCD Films

| | INDUSTRIAL GRADE DIAMOND POWDER[2] | CONTROLS | | | |
|---|---|---|---|---|---|
| | | 4 | 5 | 7A | 10 |
| Experiment No. | | 46-1 | 41-1 | 45-1 | 71-1 |
| Intensity of (hkl) reflection relative to (111)[1] % | | | | | |
| (220)[3] | 25 | 135 | 57 | 130 | 22 |
| (311) | 16 | 19 | 9 | 14 | 26 |
| (400)[4] | 8 | 24 | 13 | 22 | 13 |

[1]The relative intensity of crystals in (111) direction is normalized to 100.
[2]PDF 6-675
[3](220) Crystal orientation is parallel to (110) orientation, and therefore crystals are in the same family of planes.
[4](400) Crystal orientation is parallel to (100) orientation, and therefore crystals are in the same family of planes.

TABLE 3

| Example | 1[b] | 2[b] | 3[c] | 4[c] | 5[c] |
|---|---|---|---|---|---|
| Experiment No. | 64-1 | 69-1 | 35-3 | 36-3 | 38-3 |
| Substrate | Mo | Mo | Mo | Mo | Mo |
| Specimen Temp., °C. | 750 | 750 | 800 | 800 | 800 |
| Filament Temp., °C. | 1990 | 1980 | 2170 | 2200 | 2180 |
| Flow Rate of 1% $CH_4$ in $H_2$, sccm | 10 | 10 | 10 | 10 | 10 |
| Total Pressure, Torr | 30 | 30 | 30 | 30 | 30 |
| Deposition Time, Hrs. | 66 | 66 | 40 | 60 | 80 |
| Thickness, μm | | | | | |
| Carbide Interlayer | ~6 | ~6 | ~3 | ~6 | ~6 |
| Diamond | 13-14 | ~13 | ~13 | ~20 | ~28 |
| Deposition Rate, μm/h | 0.20 | 0.20 | 0.34 | 0.33 | 0.35 |
| Resistivity, Ohm-cm | $6.1 \times 10^{8}$ | N.D. | N.D. | $5.5 \times 10^{8}$ | N.D. |
| Observations | * | * | * | * | * |

[b]The diameter of tantalum wire used for making filament in these experiments was ~1.5 mm.
[c]The diameter of tantalum wire used for making filament in these experiments was ~1.25 mm.
*Adherent and coherent film.
N.D. - Not determined

TABLE 4

CRYSTAL ORIENTATION AND AVERAGE CRYSTALLITE SIZE OF PCD FILMS

|  | Industrial Grade Diamond Powder[2] | EXAMPLES 3 | 4 |
|---|---|---|---|
| Intensity of (hkl) reflection relative to (111)[1] % | | | |
| (220)[3] | 25 | 66 | 102 |
| (311) | 16 | 12 | 16 |
| (400)[4] | 8 | 12 | 17 |
| Average crystaline Size, Å | — | 1,300 | 1,100 |

[1] The relative intensity of crystals in (111) direction is normalized to 100.
[2] PDF 6-675
[3] (220) Crystal orientation is parallel to (110) orientation, and therefore are in the same family of planes.
[4] (400) Crystal orientation is parallel to (100) orientation, and therefore are in the same family of planes.

What is claimed is:

1. A chemical vapor deposition method for producing a coated substrate product comprising:
   placing a parent substrate comprising a material selected from the group consisting of metal, metal alloy, mixture of metals, and mixtures thereof into a hot filament chemical vapor deposition reactor;
   heating said parent substrate to a deposition temperature by means of a filament electrically charged to a temperature in the range of about 1800° to 2250° C.;
   chemically vapor depositing an adherent and coherent polycrystalline diamond layer onto the heated substrate at a deposition rate of no greater than 0.4 $\mu$m per hour by passing a gaseous mixture of about 0.1% to about 5% hydrocarbon and the balance hydrogen into said reactor under a pressure of not greater than 100 Torr for a period of at least 30 hours; and
   recovering a substrate coated with a thickness of at least about 12 $\mu$m of a smooth polycrystalline diamond layer.

2. The method of claim 1 wherein at the thickness of said polycrystalline diamond layer is in the range of about 12 $\mu$m to about 250 $\mu$m.

3. The method of claim 1 wherein at the thickness of said polycrystalline diamond layer is in the range of about 20 $\mu$m to about 130 $\mu$m.

4. The method of claim 1 wherein said polycrystalline diamond layer is chemical vapor deposited at temperatures in the range of 650° to 825° C.

5. The method of claim 1 wherein said polycrystalline diamond layer has an electrical resistivity greater than $10^6$ ohm-cm.

6. The method of claim 1 wherein said parent substrate is molybdenum.

7. The method of claim 6 wherein molybdenum carbide is formed in situ between said parent substrate and said polycrystalline diamond layer.

8. A chemical vapor deposition method for fabricating a coated substrate product comprising:
   placing a parent substrate comprising a material selected from the group consisting of metal, metal alloy, mixture of metals, and mixtures thereof into a hot filament chemical vapor deposition reactor;
   heating said parent substrate to a deposition temperature in the range of about 650° to 825° C. by means of a filament electrically charged to a temperature in the range of about 1800° to 2250° C.;
   chemically vapor depositing an adherent and coherent polycrystalline diamond layer onto the hated substrate at a rate of no greater than 0.4 $\mu$m per hour by passing a gaseous mixture of about 0.1% to about 5% hydrocarbon and the balance hydrogen into said reactor under a pressure of no greater than 100 Torr form a period of at least 30 hours;
   passing an inert gas over said coated substrate while said filament remains electrically heated for a period of time to purge said reactor of said gaseous mixture;
   cooling said coated substrate by removing the charge from said filament and continuing the passing of the inert gas over the substrate; and
   recovering a substrate coated with a thickness of at least about 12 $\mu$m of a smooth polycrystalline diamond layer exhibiting a high electrical resistivity which is selected from the group consisting of one exhibiting enhanced crystal orientation in the (220) and (400) directions, one exhibiting enhanced crystal orientation in the (311) and (400) directions and one exhibiting enhanced crystal orientation in the (220), (311) and (400) directions relative to the (111) direction in comparison to industrial grade diamond crystals.

9. The method of claim 8 wherein the total thickness of said polycrystalline diamond layer is in the range of about 12 $\mu$m to about 250 $\mu$m.

10. The method of claim 8 wherein the total thickness of said polycrystalline diamond layer is about 20 $\mu$m to about 130 $\mu$m.

11. The method of claim 8 wherein said polycrystalline diamond layer has electrical resistivity greater than $10^6$ ohm-cm.

12. The method of claim 8 wherein said parent substrate is molybdenum.

13. The method of claim 12 wherein 2 $\mu$m to 5 $\mu$m of molybdenum carbide is formed in situ between said parent substrate and said polycrystalline diamond layer.

* * * * *

UNITED STATES PATENT AND TRADEMARK OFFICE
CERTIFICATE OF CORRECTION

PATENT NO. : 5,186,973

DATED : February 16, 1993

INVENTOR(S) : Garg, et al.

It is certified that error appears in the above-identified patent and that said Letters Patent is hereby corrected as shown below:

On the title page, item [54] and in column 1, line 4:

In the title, delete "DIAMONDS" and insert therefor --DIAMOND--.

Column 4, line 53, delete "an" and insert therefor --as--.

Column 6, line 65, delete second occurrence of "is" and insert therefor --in--.

Column 7, line 58, delete "~2200.C" and insert therefor --~2200°C--.

Column 8, line 5, after "example", insert --,--.

Column 13, line 9, delete ">12µm", and insert therefor --≥12µm--.

Column 13, line 33, delete ">12µm", and insert therefor --≥12µm--.

Column 18, line 17, delete "hated", and insert therefore --heated--.

Column 18, line 22, delete "form", and insert --from--.

Inventorship name should read: Diwaker Garg, Sui-Yuan Lynn, Robert L. Iampietro, Earnest L. Wrecsics and Paul N. Dyer.

Signed and Sealed this

Fifteenth Day of March, 1994

Attest:

BRUCE LEHMAN

*Attesting Officer*  *Commissioner of Patents and Trademarks*